US 8,073,668 B2

(12) United States Patent
Kellington et al.

(10) Patent No.: US 8,073,668 B2
(45) Date of Patent: Dec. 6, 2011

(54) METHOD AND APPARATUS FOR TESTING A FULL SYSTEM INTEGRATED CIRCUIT DESIGN BY STATISTICAL FAULT INJECTION USING HARDWARE-BASED SIMULATION

(75) Inventors: Jeffrey William Kellington, Pflugerville, TX (US); Prabhakar Nandavar Kudva, Warwick, NY (US); Naoko Pia Sanda, Rensselaer, NY (US); John Andrew Schumann, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 846 days.

(21) Appl. No.: 12/022,869

(22) Filed: Jan. 30, 2008

(65) Prior Publication Data

US 2009/0193296 A1    Jul. 30, 2009

(51) Int. Cl.
G06F 17/50    (2006.01)
G06F 11/00    (2006.01)

(52) U.S. Cl. ............... 703/14; 714/29; 714/33; 714/47; 714/734; 714/E11.021

(58) Field of Classification Search ............... 703/13, 703/14; 716/4; 714/25, 28, 29, 30, 32, 33, 714/47, 724, 733, 734, 741, E11.021
See application file for complete search history.

(56) References Cited

U.S. PATENT DOCUMENTS

| 4,308,616 | A |   | 12/1981 | Timoc |
| 4,759,019 | A |   | 7/1988 | Bentley |
| 4,996,688 | A |   | 2/1991 | Byers |
| 5,513,339 | A | * | 4/1996 | Agrawal et al. ................. 703/15 |
| 5,550,844 | A |   | 8/1996 | Lucas |
| 5,896,401 | A | * | 4/1999 | Abramovici et al. .......... 714/741 |
| 6,370,492 | B1 | * | 4/2002 | Akin .............................. 703/13 |
| 6,484,276 | B1 |   | 11/2002 | Singh |
| 6,536,008 | B1 |   | 3/2003 | Nadeau-Dostie |
| 6,671,860 | B2 |   | 12/2003 | Langford |
| 6,704,894 | B1 |   | 3/2004 | Kania |

(Continued)

OTHER PUBLICATIONS

Bell—Automatic Testcase Synthesis and Performance Model Validation for High-Performance PowerPC Processors, 2006 IEEE International Symposium on Performance Analysis of Systems and Software, (Mar. 19-21, 2006), pp . 1-12.

(Continued)

*Primary Examiner* — Russell Frejd
(74) *Attorney, Agent, or Firm* — Matt Talpis; Mark P Kahler

(57) ABSTRACT

A test system tests a full system integrated circuit (IC) model that includes a device under test (DUT) IC model and a support IC model. A test manager information handling system (IHS) maps the full system IC model on a hardware accelerator simulator via an interface bus. The hardware accelerator simulator thus emulates the full system IC model. Of all possible fault injection points in the model, the test manager IHS selects a subset of those injection points for fault injection via a statistical sampling method in one embodiment. In response to commands from the test manager IHS, the simulator serially injects faults into the selected fault injection points. The test manager IHS stores results for respective fault injections at the selected injection points. If a machine checkstop or silent data corruption error occurs as a result of an injected fault, the DUT IC model may return to a stored checkpoint and resume operation from the stored checkpoint. The result information is useful in determining a soft error rate (SER) for the DUT IC.

21 Claims, 4 Drawing Sheets

U.S. PATENT DOCUMENTS

| | | | |
|---|---|---|---|
| 6,728,668 | B1 | 4/2004 | Kitamorn |
| 6,751,756 | B1 | 6/2004 | Hartnett |
| 7,020,803 | B2 | 3/2006 | Wolin |
| 7,185,232 | B1 | 2/2007 | Leavy |
| 7,191,111 | B2 | 3/2007 | Schuppe |
| 7,284,159 | B2 | 10/2007 | Chakraborty |
| 2004/0243882 | A1 | 12/2004 | Zhou |
| 2005/0050393 | A1 | 3/2005 | Chakraborty |
| 2005/0262457 | A1 | 11/2005 | Granier |
| 2007/0088520 | A1 | 4/2007 | Hagerott |

OTHER PUBLICATIONS

Faure—Single-Event-Upset-Like Fault Injection: A Comprehensive Framework, IEEE Transactions on Nuclear Science, vol. 52, No. 6 (Dec. 2006), pp. 2205-2209.

Kayser—Hyper-acceleration and HW/SW co-verification as an essential part of IBM eServer z900 verification, IBM JRD (Jul./Sep. 2002), IEEE HPCA (Nov. 2005), pp. 597-605.

Kim—Soft Error Sensitivity Characterization for Microprocessor Dependability Enhancement Strategy, IEEE DSN (2002), pp. 1-10.

Kudva—Workshop on Architectural Support for Gigascale Integration, "Fault Injection Verification of IBM Power6 Soft Error Reliance", ISCA-07, San Diego, CA (Jun. 9-13, 2007), pp. 1-5.

Nguyen—Chip-Level Soft Error Estimation Model, IEEE Transactions on Device and Materials Reliability, vol. 5, No. 3 (Sep. 2005), pp. 365-381.

Sieh—VHDL-based Fault Injection with VERIFY, Institute for Mathematical Machines, University of Erlangen-Nuremberg (1996), pp. 1-19.

Slater—Fault Injection, Carnegie Mellon University, Dependable Embedded Systems (Spring 1998), pp. 1-8.

Wang—Characterizing the Effects of Transient Faults on a High-Performance Processor Pipeline, Proc Intl. Conf. Dependable Systems and Networks, pp. 61-70, (2004).

Wazlowski—Verification Strategy for the Blue Gene/L Chip, IBM JRD (Mar./May 2005), pp. 303-318.

\* cited by examiner

METHOD AND APPARATUS FOR TESTING A FULL SYSTEM INTEGRATED CIRCUIT DESIGN BY STATISTICAL FAULT INJECTION USING HARDWARE-BASED SIMULATION

TECHNICAL FIELD OF THE INVENTION

The disclosures herein relate generally to test systems, and more particularly, to a methodology and apparatus for testing integrated circuit (IC) designs via hardware-based simulation.

BACKGROUND

An information handling system (IHS) may include a processor integrated circuit (IC) for processing, handling, communicating or otherwise manipulating information. Modern IHSs often include integrated circuits (ICs) that incorporate several components integrated together on a common semiconductor die. Some IHSs operate as test systems or test managers that evaluate the functionality and performance characteristics of IC designs during the development process of the IC design. A device under test (DUT) is another name for an IC design on which a test system conducts tests.

During operation, ICs may experience hard errors or soft errors. Hard errors are IC faults that persist over time. For example, an IC may experience a short circuit or an open circuit that does not go away with time. In contrast, a soft error is an error that may occur once and then not recur over time. For example, a cosmic ray or alpha particle may pass through a latch in the IC and cause the latch to change state or "flip". Noise in a circuit adjacent the IC may also cause a soft error.

Unfortunately, soft error rate (SER) is increasing in today's ICs due to higher device density in these ICs. Lower IC operating voltage also makes an IC more susceptible to soft errors, thus causing higher SER than in the past. Arrays within ICs, such as memory and caches, are susceptible to soft errors. Combinatorial logic within ICs is also susceptible to soft errors. A conventional way to deal with increasing SER in memory arrays is to employ error correction code (ECC) memory and scrubbing. However, increasing SER in the logic and data flow paths of ICs is a more complex problem. One approach is to employ redundancy in the logic to decrease or correct for SER. However, redundancy is a difficult and costly solution.

It is frequently hard to determine the SER of an IC or system of ICs. One way to perform an SER determination is to actually fabricate the IC or IC system. After fabrication of the IC system, specialized test apparatus may bombard the IC system with cosmic rays and alpha particles in a laboratory environment to create faults or errors. Test apparatus measures the SER of the IC system while bombardment continues. Unfortunately, this approach requires completion of the IC design and fabrication of the actual hardware of the IC system prior to testing. This approach undesirably limits the amount of controllability and observability of the IC design during experimentation.

Another way to determine SER effects is by fault injection into a software simulation or software model of a particular IC design. Unfortunately, this software simulation model approach may be very slow. The size of the software model is also typically limited such that the software model may include just a portion of the IC design rather than the entire IC design when the IC is very large.

It is desirable to provide a method and apparatus for causing soft errors in an IC design that addresses the problems above without actually fabricating the IC design in semiconductor form.

SUMMARY

In one embodiment, an integrated circuit (IC) test system is disclosed that includes a test manager information handling system (IHS) having a system memory that stores a full system model for a device under test integrated circuit (DUT IC). The full system model includes a support memory. The test system further includes a hardware accelerator simulator coupled to the test manager IHS via an interface bus. The hardware accelerator simulator includes a hardware accelerator memory. The test manager IHS is configured to transmit the full system model to the hardware accelerator simulator. The hardware accelerator simulator is also configured to map the full system model into the hardware accelerator memory so that the hardware accelerator simulator emulates the full system model, thus providing a mapped hardware accelerator simulator that emulates the DUT IC as an emulated DUT IC and emulates the support memory as an emulated memory. The full system model includes a plurality of fault injection points. The test manager IHS is configured to load an architecture verification program (AVP) into the emulated memory. The AVP is capable of testing the full system model for results of injected faults. The test manager IHS is also configured to select a subset of the plurality of fault injection points for fault injection, thus providing a plurality of selected fault injection points. The mapped hardware accelerator simulator is further configured to inject a fault into a selected fault injection point of the plurality of selected fault injection points in the full system model when commanded by the test manager IHS, and to transmit to the test manager IHS for storage a result of injecting the fault into the selected injection point. The mapped hardware accelerator simulator is also configured to inject faults at other selected fault injection points to provide respective results.

In another embodiment, a method of testing an integrated circuit (IC) is disclosed that includes transmitting, by a test manager information handling system (IHS) to a hardware accelerator simulator, a full system model for a device under test integrated circuit (DUT IC). The full system model includes a support memory. The method also includes mapping, by the hardware accelerator simulator, the full system model into a hardware accelerator memory of the hardware accelerator simulator so that the hardware accelerator simulator emulates the full system model, thus providing a mapped hardware accelerator simulator that emulates the DUT IC as an emulated DUT IC and emulates the support memory as an emulated memory. The full system model includes a plurality of fault injection points. The method further includes loading, by the test manager IHS, an architecture verification program (AVP) into the emulated memory, the AVP being capable of testing the full system model for results of injected faults. The method still further includes selecting, by the test manager IHS, a subset of the plurality of fault injection points for fault injection, thus providing a plurality of selected fault injection points. The method also includes injecting a fault, by the mapped hardware accelerator simulator as commanded by the test manager IHS, into a selected fault injection point of the plurality of selected fault injection points in the full system model. The method further includes storing, by the test manager IHS, a result of the fault injection of the injecting step, the result being detected by the AVP. The method also includes repeating the injecting and storing steps for other selected fault injection points to collect respective results for fault injections at respective fault injection points.

BRIEF DESCRIPTION OF THE DRAWINGS

The appended drawings illustrate only exemplary embodiments of the invention and therefore do not limit its scope because the inventive concepts lend themselves to other equally effective embodiments.

DETAILED DESCRIPTION

While it is well known that soft errors in logic are a concern in modern IC design, systematic accounting of the impact of "flipped bits" or "bit flips" at the microarchitecture level is difficult to achieve. In IC devices, the soft error rate (SER) is said to be "derated" because not all bit flips result in application errors. Whether or not a bit flip propagates to the application level depends upon several factors. These factors include the location of the bit flip in a latch, logic gate, or memory cell, the time that the bit flip occurred, and the particular activity of the chip at the time of the bit flip. To obtain an accurate SER estimate for a given IC design, it is critical to accurately represent derating.

"Derating" is a characteristic of SER in the logic of an IC design that is both beneficial and challenging. Not every soft error or flipped bit in the logic of an IC design causes a problem. Many soft errors simply vanish. Hardware checkers or software checkers may detect other soft errors and rely on correction apparatus to correct such errors. The number of flipped bits or upsets that become machine checkstops or silent data corruptions may be very small in some cases. Under one definition, "derating" is the ratio of the total number of flipped bits to the number of flipped bits that actually causes a significant error. Fortunately, not every bit flip contributes to the actual system failure rate.

Figure 1:
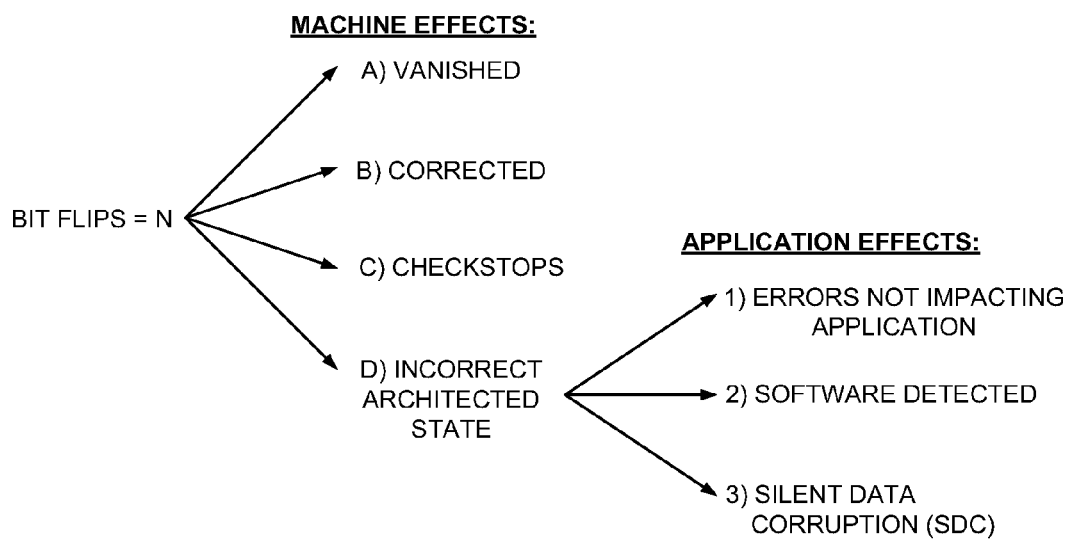
FIG. 1 is a representation of behaviors of interest with respect to soft errors.

FIG. 1 shows the possible outcomes of a soft error, namely several behaviors of interest. In a scenario where an integrated circuit design is a processor that executes an application, N is the total number of bit flips, namely the total number of soft errors that the processor exhibits for a given time period or given number of machine cycles. A bit flip or soft error may A) vanish with no effect on the application output. The bit flip may also B) experience correction by the processor IC via error correction. Another possible outcome of a soft error is C) the processor IC produces a checkstop that halts execution of the application. Yet another possible outcome of a soft error is D) the soft error causes the processor IC to exhibit an incorrect architected state. In other words, the soft error undesirably modifies the architected state of the processor. These effects A-D are machine effects in that they impact the hardware of the processor IC under test. In case D, where the soft error causes the processor to exhibit an incorrect architected state, 3 results or application effects are possible. For example, the soft error may 1) not impact the execution of the application. It is also possible that 2) software may detect the error. It is further possible that 3) the soft error may result in silent data corruption (SDC). These effects 1-3 are application effects in that they affect the software application that the processor IC executes. As discussed above, not every soft error results in an undesirable check stop or incorrect architected state error. However, if every soft error did result in a checkstop or incorrect architected state error, then the derating number for this scenario would be "1 to 1". If every 100 soft errors result in a checkstop or incorrect architected state error, then the derating number is "100 to 1" or simply 100. If every 500 soft errors result in a checkstop or incorrect architected state error, then the derating number is "500 to 1" or simply 500. Thus, higher derating numbers are more desirable than lower derating numbers.

Figure 2:
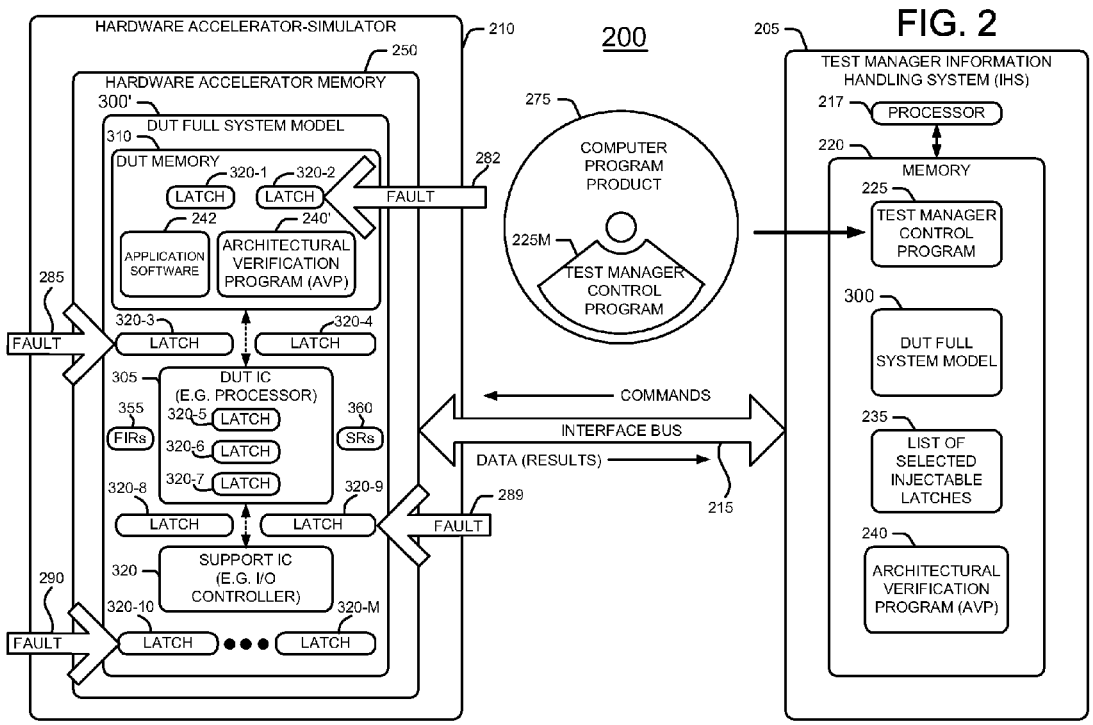
FIG. 2 shows one embodiment of the disclosed test system.

FIG. 2 is a block diagram of a test system 200 that includes a test manager information handling system, namely test manager 205, and a hardware accelerator simulator 210. Test manager IHS 205 couples to hardware accelerator simulator 210 via an interface bus 215. Test manager IHS 205 controls the operation of hardware accelerator simulator 210. Test manager 205 exhibits processing and storage capabilities. For example, test manager IHS 205 includes a processor 217 that couples to a memory store 220. In one embodiment, memory store 220 stores a test manager control program 225, a device under test (DUT) full system model 300, a list of fault injectable latches 235 and an architectural verification program (AVP) 240. Memory store 220 may be volatile or non-volatile storage.

Test manager IHS 205 injects faults or errors into selected latches of the DUT full system model 300 after installing model 300 in hardware accelerator simulator 210, as described in more detail below. While DUT full system model 300 may include hundreds, thousands, millions or more fault injectable latches, test manager control program 225 will instruct hardware accelerator simulator 210 to inject faults or errors into a selected subset of these latches, for example 20 latches, in one embodiment. In this scenario, list 235 defines the particular selected 20 latches for which the designer, user or other entity desires to inject with respective faults. In actual practice, list 235 may specify a greater or smaller number of latches for fault injection, depending on the particular application. Test manager control program 225 controls the transmission of DUT full system model 300 over interface bus 215 to hardware accelerator simulator 210. In one embodiment, test manager 200 may inject faults into multiple IC models simultaneously. Test manager 200 may employ the same list of injectable latches 235 to inject these multiple IC models with faults. List 235 may specify different latches in different IC models for fault injection. In another embodiment, it is also possible to perform multiple fault injections on respective multiple fault injection points at the same time.

Figure 3:
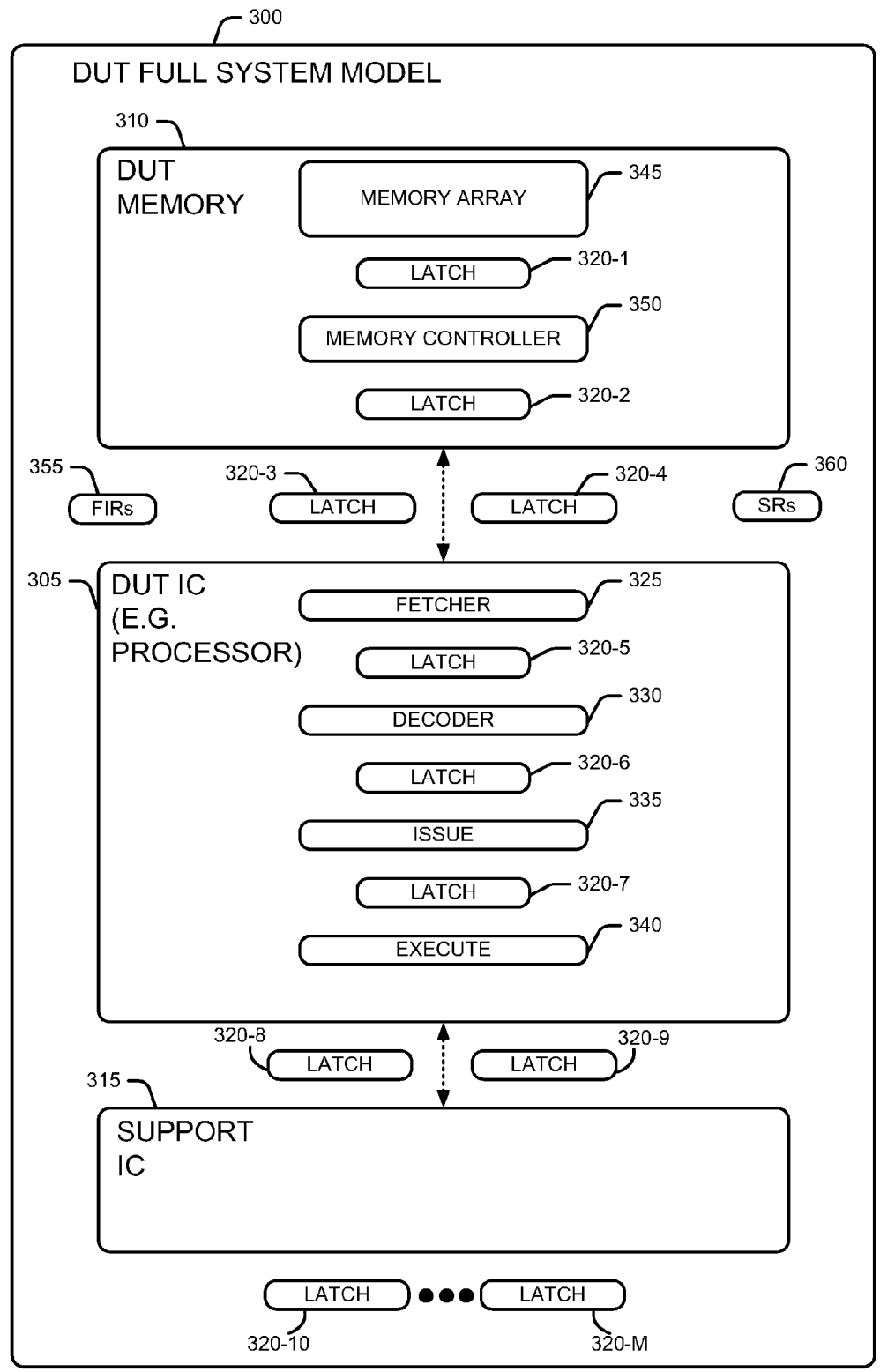
FIG. 3 is a block diagram of a representative DUT full system model that the test system of FIG. 2 employs.

FIG. 3 shows a more detailed block diagram of a representative DUT full system model 300. DUT full system model 300 represents the entire IC system under test. In other words, DUT full system model 300 includes not only an IC device under test (DUT) 305, but also includes other support ICs that the DUT IC 305 requires to function properly, such as a DUT memory 310 and a support IC 315 in one example. Support memory 310 is another name for DUT memory 310. In one example wherein DUT IC 305 is a processor, support IC 315 is an I/O controller that operates in cooperation with the processor DUT IC 305. DUT memory 310 further cooperates with processor DUT IC 305. In this scenario, processor DUT IC 305, DUT memory 310 and I/O controller support IC 315 together form a complete or full information handling system (IHS) within DUT full system model 300.

DUT full system model 300 includes numerous latches throughout processor DUT IC 305, DUT memory 310 and support IC 315 as shown in FIG. 3. In one embodiment, these latches are fault injectionable latches. The term fault injectionable latch means that a mechanism may inject a fault into such a latch. The test system may then observe the impact, if any, that an injected fault causes. These fault injectable latches may include latches 320-1, 320-2, 320-3, . . . 320-M wherein M is the total number of fault injectable latches in model 300. For example, processor DUT IC 305 includes several pipeline stages with fault injectionable latches 320 in between these stages. More particularly, processor DUT IC 305 includes a fetcher 325, an instruction decoder 330, an issue stage 335 and an execute stage 340 with latches 320-5, 320-6 and 320-7 in between these pipeline stages.

DUT memory 310 includes fault injectionable latches 320-1 and 320-2. DUT full system model 300 also includes fault injectionable latches 320-3 and 320-4 between processor DUT IC 305 and DUT memory 310. DUT full system model 300 further includes fault injectionable latches 320-8 and 320-9 between processor DUT IC 305 and support IC 315. DUT full system model 300 may include fault injectionable latches 320-10, . . . 320-M at other locations within the model as well depending on the particular application. These fault injectionable latches 320-1, 320-2, 320-3, . . . 320-M are the prospective targets for the injection of faults or errors by test manager control program 225. FIG. 2 also shows latches 320-1, 320-2, 320-3, . . . 320-M in DUT full system model 300' of test system 200. The publication "Automatic Testcase Synthesis and Performance Model Validation for High-Performance PowerPC Processors", by Bell et al., 2006 IEEE International Symposium on Performance Analysis of Systems and Software, Mar. 19-21, 2006, the disclosure of which is incorporated herein by reference in its entirety, discusses methodology for creating a model of an IC design.

In one embodiment, the fault injectionable latches of DUT full system model 300 are non-array latches, namely latches other than those latches within arrays such as memory array 345. In another embodiment, the fault injectionable latches include array latches such as those latches (not shown) within memory array 345. Latches within a data path are fault injectionable latches. Thus, latches 320-1 and 320-2 are fault injectionable latches. Soft errors within memory arrays are repairable using error correction codes (ECC) techniques. However, soft errors in non-array latches are not so easily correctable, thus making soft error rates (SER) for non-array latches harder to determine. Commonly known techniques such as ECC and scrubbing may detect and enable recovery from faults in arrays. Error detection and correction is more difficult in logic such as data paths and control paths. The impact of errors in logic is far more difficult to assess than errors in arrays. In DUT full system model 310, latches 320-1, 320-2, 320-3 . . . 320-N are within a data path.

Prior to testing, test manager control program 225 of test manager IHS 205 maps or loads DUT full system model 300 into hardware accelerator simulator 210, thus forming a mapped hardware accelerator simulator 210. In other words, test manager control program 225 installs DUT full system model 300 in hardware accelerator simulator 210. The designation, DUT full system model 300', refers to the DUT full system model 300 after mapping or loading into hardware accelerator simulator 210. More particularly, DUT full system model 300 maps or loads into hardware accelerator memory 250 to form loaded or installed DUT full system model 300'. Once full system model 300' loads, test manager control program 225 transmits architectural verification program (AVP) 240 from test manager IHS 205 over the interface bus 215 to mapped hardware accelerator simulator 210. AVP 240 loads into the DUT memory 310 of the DUT full system model 300' that hardware accelerator memory 250 stores. The designation, AVP 240', refers to the architectural verification program 240 after loading into DUT memory 310. AVP 240' may highly utilize or exercise DUT full system model 300'. AVP 240' monitors for and detects checkstops and SDC errors that DUT full system model 300' may experience as a consequence of injected faults. In an alternative embodiment, test system 200 includes application software 242 in DUT memory 310 wherein application software 242 executes on DUT processor 305. In this embodiment, application software 242 may include AVP 240 or the testing functionality of AVP 240. When application software 242 includes this testing functionality, application software 242 performs AVP functions such as checking for errors.

Test manager control program 225 sends commands to hardware accelerator simulator 210 and the structures therein to control fault injection testing of the particular selected non-array latches 320 in DUT full system model 300'. In other embodiments, test manager control program 225 may select array latches or particular data nodes in combinatorial logic for fault injection. Referring to FIGS. 2 and 3, test manager program 225 performs a statistical selection of particular latches 320 for testing as a subset of all latches 320 present in DUT full system model 300'. In other words, test manager control program 225 employs a statistical fault injection (SFI) methodology to test DUT full system model 300'. One method of statistical fault injection (SFI) is discussed by Nguyen, et al. in "Chip-Level Soft Error Estimation Method", IEEE Transactions on Device and Materials Reliability, Vol. 5, No. 3, September, 2005, the disclosure of which is incorporated herein by reference in its entirety. Test manager control program 225 sends a list of statistically selected injectable latches 235 to hardware accelerator simulator 210. Hardware accelerator simulator 210 provides a structure and mechanism to inject an error or fault at the location of a fault injection point, such as the selected latches 320-1, 320-2, . . . 320-M, that list 235 specifies.

In one embodiment, hardware accelerator simulator 210 under command by test manager control program 225, injects faults into latches 320 one latch at a time. The test manager control program 225 then queries the hardware accelerator simulator 210 through the bus interface 215 to verify if checkstops or error recoveries occurred. To perform this verification, test manager control program 225 may check the state of fault isolation registers (FIRs) 355 within the DUT full system model 300' after a fixed number of simulation cycles. The test manager control program 225 may also employ bus interface 215 to query for SDC errors the special registers (SRs) 360 in model 300' set by the AVP 240'. The test manager control program 225 may query the results of fault injection one latch at a time after testing each respective latch injection point. In other words, this approach involves serially injecting faults, one fault injection point at a time and recording results from one injection point at a time. Hardware accelerator simulator 210 sends the requested results back to test manager control program 225 via interface bus 215. A designer, user or other entity may review these results at test manager IHS 205 and determine a soft error rate (SER) therefrom. While in this particular example, list 235 specifies 20 injection points or latches in DUT full system model 300', for purposes of illustration FIG. 2 shows representative fault injections into injection points or latches 320-2, 320-3, 320-9 and 320-10 as indicated respectively by fault injection arrows 282, 285, 289 and 290.

Figure 4:
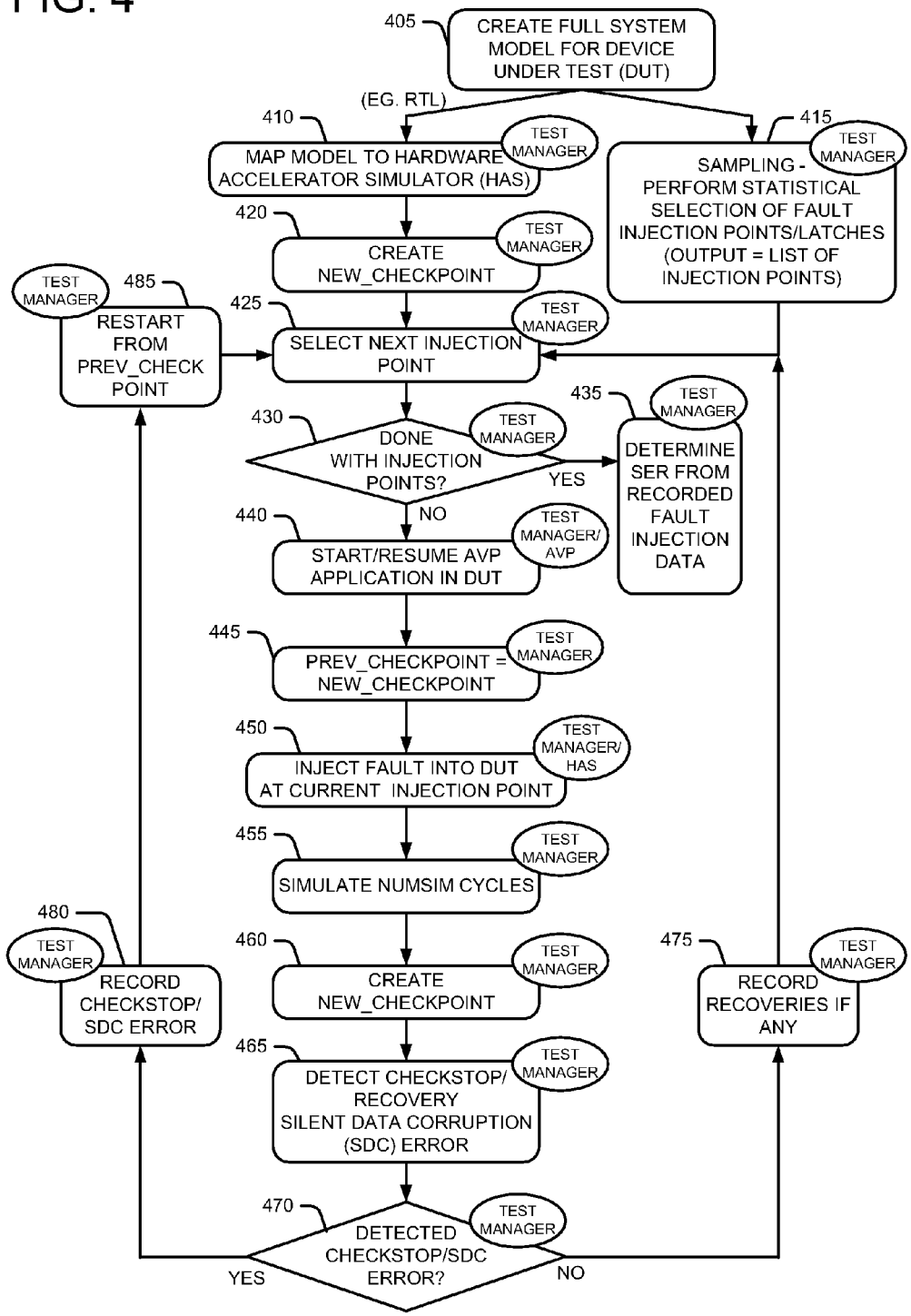
FIG. 4 is a flowchart that shows one embodiment of the testing methodology that the disclosed test system employs.

FIG. 4 is a flowchart that shows more details of the disclosed testing methodology. The methodology begins with creating a full system model 300 for the device under test (DUT), as per block 405. This model may be in the form of register transfer logic (RTL), VHSIC Hardware Description Language (VHDL) or other hardware description language. In a case where the DUT IC 305 is a processor, the full system model 300 may include not only the RTL model for the processor DUT IC 305, but also may include the RTL models for related ICs such as DUT memory 310 and the RTL model for support IC 315.

Test manager control program 225 maps the DUT full system model 300 to hardware accelerator simulator (HAS) 210, as per block 410. Hardware accelerator simulator 210 stores the DUT full system model 300 in hardware accelerator memory 250 as DUT full system model 300'. Hardware accelerator simulator 210 is reconfigurable hardware responsive to the model mapped into its memory 250. By mapping or storing DUT full system model 300 in hardware accelerator memory 250, hardware accelerator simulator 210 takes on the actual functions at the gate level that DUT full system model 300 specifies. In other words, hardware accelerator simulator 210 simulates the DUT full system model 300 with all of its logic, processing, data handling and storage functions.

At the same time that the mapping of DUT full system model 300 is underway, test manager control program 225 performs a statistical sampling of all possible fault injection points (e.g. latches) in model 300 to select particular fault injection points usable for model testing purposes, as per block 415. Test manager control program 225 may base this selection on different criteria. For example, in one embodiment, random selection of particular fault injection points is possible. In another embodiment, the criteria for latch selection may be the function of particular latches. The particular type of latch may provide other criteria for latch selection. The location of particular latches in DUT IC 305, support IC 320 and DUT memory 310 may provide still other criteria for latch or fault injection point selection. Test manager control program 225 thus generates a list of selected injection points 235 as output.

Test manager control program 225 creates a new checkpoint (NEW_CHECKPOINT), as per block 420. The new checkpoint includes the complete state of DUT full system model 300' before fault or error injection commences. For example, in the embodiment of FIG. 2 wherein the DUT full system model 300' includes a processor DUT IC 305, the complete state of the model includes the current state of a program counter (not shown), a register file (not shown in), instruction registers (not shown) and the complete state of DUT memory 310. In other words, the new checkpoint includes the complete state of the machine that DUT full system model 300' forms.

Test manager control program 225 then selects the next injection point or latch, as per block 425. This next injection point becomes the current injection point. Since this is the first time that control program 225 executes the select next injection point block 425, control program 225 now processes the first injection point of injection point list 235 as the current injection point. Test manager control program 225 performs a test to determine if the program is done with all injection points in injection point list 235, as per decision block 430. If the answer is "yes" that control program 225 already processed all injection points on list 235, then process flow ends with a determination of soft error rate (SER) from recorded fault injection data at block 435. However, since this is the first time through a loop that the flowchart of a FIG. 4 forms, test manager control program 225 still must process more injection points on list 235. Thus, test manager control program 225 loads architectural verification program (AVP) 240 into DUT memory 310 as AVP 240', as per block 440. In response, AVP 240' launches and commences computing activities that provide high utilization of DUT IC 305. AVP 240' will later check the state of DUT IC 305 to determine if any SDC errors occurred due to fault injection. Test manager control program 225 saves the current checkpoint or machine state for later reference, for example by setting PREV_CHECKPOINT=NEW_CHECKPOINT, as per block 445. Test manager control programs saves the current NEW_CHECKPOINT as a PREV_CHECKPOINT for use in a later comparison with the state of the machine after an error injection as discussed below.

Test manager control program 225 instructs hardware accelerator simulator 210 to inject a fault or error at the current injection point of list 235, as per block 450. FIG. 4 uses the abbreviation "HAS" for hardware accelerator simulator 210. In response to commands that test manager control program 225 sends via the interface bus 215, hardware accelerator simulator 210 serially injects one fault at a time each time through the fault injection loop of blocks 425, 430, . . . 470 of the flowchart of FIG. 4. Test manager control program 225 instructs hardware accelerator simulator 210 to execute for a number of cycles equal to NUMSIM, as per block 455. Values of NUMSIM may range from 1000 cycles to 1,000,000 cycles depending on the particular application. Values of NUMSIM outside of this range may also be acceptable depending on the particular application. If NUMSIM=10,000, then hardware accelerator simulator 210 executes 10,000 simulated cycles at simulate cycles block 455. After such simulation, test manager control program 225 creates a new checkpoint, NEW_CHECKPOINT, that saves the complete current state of the machine, namely full model 300', as per block 460.

Test manager control program 225 then checks fault isolation registers (FIRs) 355 in DUT full system model 300' to determine if a checkstop or recovery occurred, as per block 465. Test manager control program 223 may also check the special registers (SRs) 360 set by AVP 240' to detect the occurrence of silent data corruption (SDC) error during the NUMSIM cycles of simulation, as per block 465. If test manager control program 225 did not detect a checkstop or silent data error then, as per decision block 470, test manager control program 225 records an error recovery if an error recovery occurred, as per block 475. Test manager control program 225 also records the particular injection point for the injected fault that caused the error from which recovery was necessary. The results or data that block 475 stores are recorded fault injection data results. Test manager control program 225 stores or saves all of this error or fault information in memory 220. Process flow loops back to select next injection point block 425. Test manager control program 225 advances to the next fault injection point in list 235 and repeats the error injection process discussed above.

However, if at decision block 470, test manager control program 225 finds a checkstop or SDC error, then test manager control program 225 records the checkstop or SDC error, as per block 480. Test manager control program 225 also records the particular injection point for the injected fault that caused the checkstop or SDC error. The results or data that block 480 stores are recorded fault injection data results. Test manager control program 225 stores this fault injection data or results in memory 220. In this case, the state of the machine is bad due to the checkstop or SDC error. In response to this checkstop or SDC error, test manager control program 225 restarts the DUT full system model 200' at the last good checkpoint, namely PREV_CHECKPOINT, as per block 485. This restores the prior good state of the machine. Process flow then loops back to select next injection point block 425.

Test manager control program 225 advances to the next fault injection point in list 235 and repeats the fault injection process. This process of injecting faults at predetermined selected injection points or latches continues until decision block 430 determines that hardware accelerator simulator 250 is done injecting faults into all injection points on list 235. At this point, as per block 435, the designer, user or other entity may use the stored results, namely the recorded fault injection data results, to determine a soft error rate for the integrated circuit that DUT full system model 300 represents.

The test manager control program 225 uses the recorded errors to determine derating by computing the ratio of the total number of fault injections to the number of fault injections that resulted in a bad state of DUT model 300'. Recorded checkstops or recorded SDC errors signify a bad state of DUT model 300'. Test manager control program 225 also determines other metrics of interest such as the ratio of the number of checkstops and SDCs to the total number of injected faults. Moreover, test manager control program 225 provides information that identifies which regions of the DUT full system model 300' are more sensitive to checkstops and SDCs. This information may be useful in redesign or improvement of the DUT.

Prior to loading test manager control program 225 on test manager IHS 205, test manager control program 225 may reside on another medium 275 as a computer program product. For example, test system 200 may employ a compact disk (CD), digital versatile disk (DVD), floppy disk, external hard disk or virtually any other digital storage medium as medium 275. Medium 275 stores software including test manager control program 225M thereon. The designation, test manager control program 225M, describes test manager control software 225 before loading into memory 220 for execution. A user or other entity installs software such as test manager control program 225M on test system 200 prior to conducting testing with the test manager control program 225. The designation test manager control program 225 denotes test manager control program 225M after installation in test manager IHS 205.

In one embodiment, test manager control program 225 implements the disclosed methodology as a set of instructions (program code) in a code module which may, for example, reside in the memory 220 of test system 200 of FIG. 2. Until test system 200 requires this set of instructions, another memory store (not shown) such as a hard disk drive, or a removable memory such as an optical disk or floppy disk, may store this set of instructions. Test system 200 may also download this set of instructions via the Internet or other computer network. Thus, a computer program product may implement the disclosed methodology for use in a computer such as test system 200. In such a software embodiment, RAM or memory 220 may store code that carries out the functions described in the flowchart of FIG. 4 while processor 217 of test manager IHS 205 executes such code. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps.

While the embodiment that FIG. 2 depicts shows a DUT full system model 300' that includes a processor DUT IC 305, a DUT memory 310 and a support IC 320, these structures may all reside on a common semiconductor die as a system on a chip (SOC). Moreover, DUT IC 305 may be many different types of IC other than a processor, for example a microcontroller, communication IC, digital signal processor (DSP), an application specific integrated circuit (ASIC), as well as other types of ICs.

Modifications and alternative embodiments of this invention will be apparent to those skilled in the art in view of this description of the invention. Accordingly, this description teaches those skilled in the art the manner of carrying out the invention and is intended to be construed as illustrative only. The forms of the invention shown and described constitute the present embodiments. Persons skilled in the art may make various changes in the shape, size and arrangement of parts. For example, persons skilled in the art may substitute equivalent elements for the elements illustrated and described here. Moreover, persons skilled in the art after having the benefit of this description of the invention may use certain features of the invention independently of the use of other features, without departing from the scope of the invention.

What is claimed is:

1. An integrated circuit (IC) test system, comprising:
a test manager information handling system (IHS) that includes a system memory that stores a full system model for a device under test integrated circuit (DUT IC), the full system model including a support memory;
a hardware accelerator simulator, coupled to the test manager IHS via an interface bus, the hardware accelerator simulator including a hardware accelerator memory;
the test manager IHS being configured to transmit the full system model to the hardware accelerator simulator;
the hardware accelerator simulator being configured to map the full system model to the hardware accelerator memory so that the hardware accelerator simulator emulates the full system model, thus providing a mapped hardware accelerator simulator that emulates the DUT IC as an emulated DUT IC and emulates the support memory as an emulated memory, the full system model including a plurality of fault injection points;
the test manager IHS being configured to load an architecture verification program (AVP) into the emulated memory, the AVP testing the full system model for results of injected faults, and to select a subset of the plurality of fault injection points for fault injection, thus providing a plurality of selected fault injection points, wherein the test manager IHS selects the subset of the plurality of fault injection points for fault injection at the same time that the hardware accelerator simulator maps the full system model into the hardware accelerator; and
the mapped hardware accelerator simulator being further configured to inject a fault into a selected fault injection point of the plurality of selected fault injection points in the full system model when commanded by the test manager IHS, and to transmit to the test manager IHS for storage a result of injecting the fault into the selected injection point, the mapped hardware accelerator simulator being further configured to inject faults at other selected fault injection points to provide respective results.

2. The IC test system of claim 1, wherein the full system model includes a first model for the DUT IC and a second model for at least one supporting IC that operates cooperatively with the DUT IC, the at least one supporting IC of the second model including the support memory.

3. The IC test system of claim 1, wherein the full system model represents a system on a chip (SOC).

4. The IC test system of claim 1, wherein the test manager selects the subset of the plurality of injection points by random selection.

5. The IC test system of claim 1, wherein the test manager selects the subset of the plurality of injection points by statistical sampling.

6. The IC test system of claim 1, wherein the injection points of the full system model correspond to non array latches.

7. The IC test system of claim 1, wherein the test manager is configured to store results from the mapped hardware accelerator simulator.

8. The IC test system of claim 1, wherein the test manager IHS includes the AVP, the test manager IHS being configured to transmit the AVP to the emulated memory in the hardware accelerator simulator via the interface bus.

9. The IC test system of claim 1, wherein the AVP is configured to highly utilize the DUT full system model and to detect silent data corruption errors and checkstops in the DUT full system model that result from injected faults.

10. A method of testing an integrated circuit (IC), the method comprising:

transmitting, by a test manager information handling system (IHS) to a hardware accelerator simulator, a full system model for a device under test integrated circuit (DUT IC), the full system model including a support memory;

mapping, by the hardware accelerator simulator, the full system model into a hardware accelerator memory of the hardware accelerator simulator so that the hardware accelerator simulator emulates the full system model, thus providing a mapped hardware accelerator simulator that emulates the DUT IC as an emulated DUT IC and emulates the support memory as an emulated memory, the full system model including a plurality of fault injection points;

loading, by the test manager IHS, an architecture verification program (AVP) into the emulated memory, the AVP testing the full system model for results of injected faults;

selecting, by the test manager IHS, a subset of the plurality of fault injection points for fault injection, thus providing a plurality of selected fault injection points, wherein the selecting a subset of the plurality of fault injection points for fault injection is performed at the same time as the mapping of the full system model into the hardware accelerator;

injecting a fault, by the mapped hardware accelerator simulator as commanded by the test manager IHS, into a selected fault injection point of the plurality of selected fault injection points in the full system model;

storing, by the test manager IHS, a result of the fault injection of the injecting step, the result being detected by the AVP; and repeating the injecting and storing steps for other selected fault injection points to collect respective results for fault injections at respective fault injection points.

11. The method of claim 10, wherein the full system model includes a first model for the DUT IC and a second model for at least one supporting IC that operates cooperatively with the DUT IC, the at least one supporting IC of the second model including the support memory.

12. The method of claim 10, wherein the selecting step selects the subset of the plurality of injection points by random selection.

13. The method of claim 10, wherein the selecting step selects the subset of the plurality of injection points by a statistical sampling method.

14. The method of claim 10, wherein the injection points of the full system model correspond to non array latches.

15. The method of claim 10, wherein the injecting step and storing step inject a fault and store a result one fault injection at a time.

16. The method of claim 10, further comprising determining a soft error rate (SER) for the full system model from the fault injection results.

17. The method of claim 10, further comprising transmitting, by the test manager IHS, the AVP from the test manager IHS to the mapped hardware accelerator simulator.

18. The method of claim 10, wherein the AVP is configured to highly utilize the DUT full system model and to detect silent data corruption errors and checkstops in the DUT full system model that result from injected faults.

19. A computer program product, comprising:

a computer readable storage medium;

first instructions that store a full system model for a device under test integrated circuit (DUT IC) on a test manager information handling system (IHS), the full system model including a support memory;

second instructions that map the full system model from the test manager IHS into a hardware accelerator simulator that emulates the full system model, thus providing a mapped hardware accelerator simulator that emulates the DUT IC as an emulated DUT IC and emulates the support memory as an emulated memory, the full system model including a plurality of fault injection points;

third instructions that load an architecture verification program (AVP) into the emulated memory, the AVP testing the full system model for results of injected faults;

fourth instructions that select a subset of the plurality of fault injection points for fault injection, thus providing a plurality of selected fault injection points, such that the test manager IHS selects the subset of the plurality of fault injection points at the same time that the full system model maps to the hardware accelerator simulator;

fifth instructions that inject a fault into a selected fault injection point of the plurality of selected fault injection points in the full system model;

sixth instructions that store a result of the fault injection, the result being detected by the AVP; and seventh instructions that repeat the injecting a fault and storing a result for other selected fault injection points to collect, by the test manager IHS, respective results for fault injections at respective fault injection points;

wherein the first, second, third, fourth, fifth, sixth and seventh instructions are stored on the computer readable storage medium.

20. The computer program product of claim 19, wherein the fourth instructions that select a subset of the plurality of fault injection points for fault injection employ random selection to select the injection points.

21. The computer program product of claim 19, wherein the fourth instructions that select a subset of the plurality of fault injection points for fault injection employ statistical sampling to select the injection points.

* * * * *